United States Patent
Lee et al.

(10) Patent No.: US 10,991,795 B2
(45) Date of Patent: Apr. 27, 2021

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventors: Yen-Ru Lee, Hsinchu (TW); Chii-Horng Li, Zhubei (TW); Chien-I Kuo, Hsinchu (TW); Heng-Wen Ting, Hsinchu (TW); Jung-Chi Tai, Tainan (TW); Li-Li Su, ZhuBei (TW); Tzu-Ching Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/594,851

(22) Filed: Oct. 7, 2019

(65) Prior Publication Data
US 2020/0035784 A1 Jan. 30, 2020

Related U.S. Application Data

(63) Continuation of application No. 15/883,179, filed on Jan. 30, 2018, now Pat. No. 10,468,482, which is a
(Continued)

(51) Int. Cl.
*H01L 29/06* (2006.01)
*H01L 21/02* (2006.01)
(Continued)

(52) U.S. Cl.
CPC ...... *H01L 29/0649* (2013.01); *H01L 21/0243* (2013.01); *H01L 21/0262* (2013.01);
(Continued)

(58) Field of Classification Search
CPC ............ H01L 29/0649; H01L 29/0653; H01L 21/0243; H01L 21/02433; H01L 21/02529;
(Continued)

(56) References Cited

U.S. PATENT DOCUMENTS 9,117,909 B2   8/2015   Kuo et al.
9,312,384 B2   4/2016   Lo et al.
(Continued)

FOREIGN PATENT DOCUMENTS

CN   103227202 A   7/2013
CN   103681347 A   3/2014
(Continued)

*Primary Examiner* — Su C Kim
(74) *Attorney, Agent, or Firm* — Slater Matsil, LLP

(57) ABSTRACT

A method includes forming a crown structure over a substrate; forming fins in the crown structure; forming an intra-device isolation region between the fins and forming inter-device isolation regions on opposing sides of the crown structure; forming a gate structure over the fins; forming a dielectric layer that extends continuously over the inter-device isolation regions, the fins and the intra-device isolation region; performing an etching process to reduce a thickness of the dielectric layer, where after the etching process, upper surfaces of the inter-device isolation regions and upper surfaces of the fins are exposed while an upper surface of the intra-device isolation region is covered by a remaining portion of the dielectric layer; and forming an epitaxial structure over the exposed upper surfaces of the fins, where after the epitaxial structure is formed, there is a void between the epitaxial structure and the intra-device isolation region.

20 Claims, 9 Drawing Sheets

Related U.S. Application Data continuation of application No. 14/854,915, filed on Sep. 15, 2015, now Pat. No. 9,905,641.

(51) Int. Cl.

| | | |
|---|---|---|
| *H01L 21/283* | (2006.01) | |
| *H01L 21/306* | (2006.01) | |
| *H01L 21/762* | (2006.01) | |
| *H01L 21/764* | (2006.01) | |
| *H01L 29/08* | (2006.01) | |
| *H01L 29/66* | (2006.01) | |
| *H01L 29/78* | (2006.01) | |
| *H01L 21/3065* | (2006.01) | |

(52) U.S. Cl.
CPC .. *H01L 21/02433* (2013.01); *H01L 21/02529* (2013.01); *H01L 21/283* (2013.01); *H01L 21/30604* (2013.01); *H01L 21/764* (2013.01); *H01L 21/76224* (2013.01); *H01L 29/0653* (2013.01); *H01L 29/0847* (2013.01); *H01L 29/66795* (2013.01); *H01L 29/785* (2013.01); *H01L 21/3065* (2013.01); *H01L 29/7848* (2013.01)

(58) Field of Classification Search
CPC .............. H01L 21/0262; H01L 21/283; H01L 21/30604; H01L 21/76224; H01L 21/764; H01L 29/0847; H01L 29/66795; H01L 29/785; H01L 29/7848; H01L 21/3065; H01L 21/762; H01L 21/823431; H01L 27/0886; H01L 29/0657; H01L 29/4236; H01L 29/66287; H01L 29/7831; H01L 29/7846; H01L 29/7855; H01L 2924/13067

See application file for complete search history.

(56) References Cited

U.S. PATENT DOCUMENTS

| | | | |
|---|---|---|---|
| 9,905,641 | B2 | 2/2018 | Lee et al. |
| 10,468,482 | B2* | 11/2019 | Lee ............... H01L 21/0243 |
| 2010/0015778 | A1* | 1/2010 | Lin ............... H01L 21/76232 |
| | | | 438/443 |
| 2011/0210404 | A1 | 9/2011 | Su et al. |
| 2012/0049294 | A1 | 3/2012 | Chen et al. |
| 2012/0091538 | A1 | 4/2012 | Lin et al. |
| 2013/0171790 | A1 | 7/2013 | Wang |
| 2014/0042500 | A1 | 2/2014 | Wann et al. |
| 2014/0065782 | A1* | 3/2014 | Lu ............... H01L 29/785 |
| | | | 438/294 |
| 2014/0217517 | A1* | 8/2014 | Cai ............... H01L 27/0886 |
| | | | 257/401 |
| 2014/0264489 | A1 | 9/2014 | Wong et al. |
| 2014/0367798 | A1 | 12/2014 | Kuo et al. |
| 2015/0108544 | A1 | 4/2015 | Ching et al. |
| 2015/0137308 | A1 | 5/2015 | Akarvardar et al. |
| 2015/0187914 | A1 | 7/2015 | Basker et al. |
| 2015/0318399 | A1 | 11/2015 | Jeong et al. |
| 2015/0364579 | A1* | 12/2015 | Jangjian ............ H01L 29/66795 |
| | | | 257/401 |
| 2016/0111542 | A1* | 4/2016 | Zhang ............ H01L 21/823431 |
| | | | 257/401 |

FOREIGN PATENT DOCUMENTS

| | | |
|---|---|---|
| CN | 104752229 A | 7/2015 |
| DE | 102014100397 A1 | 7/2014 |
| KR | 20140029094 A | 3/2014 |

\* cited by examiner

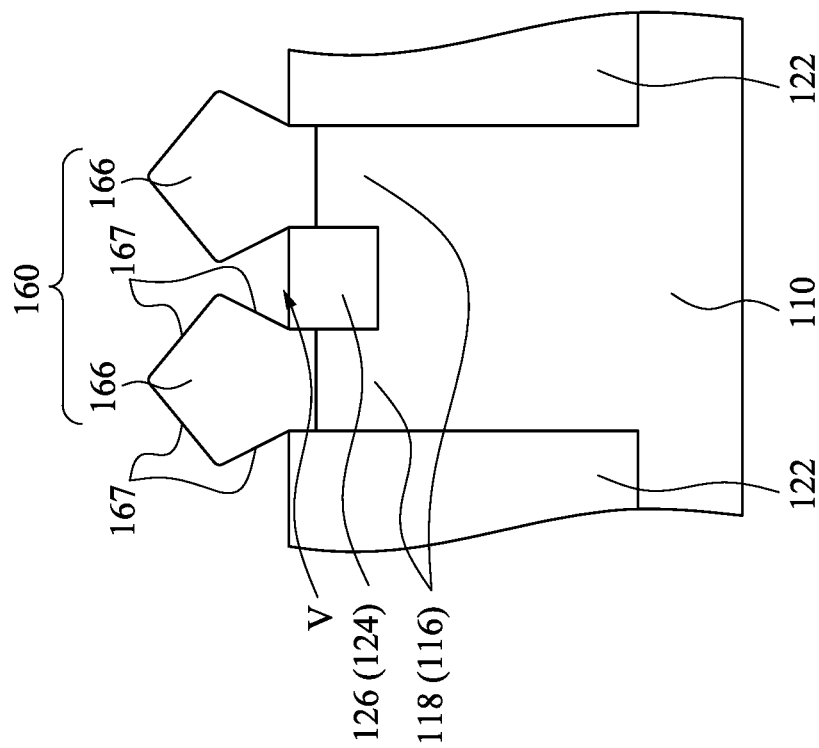
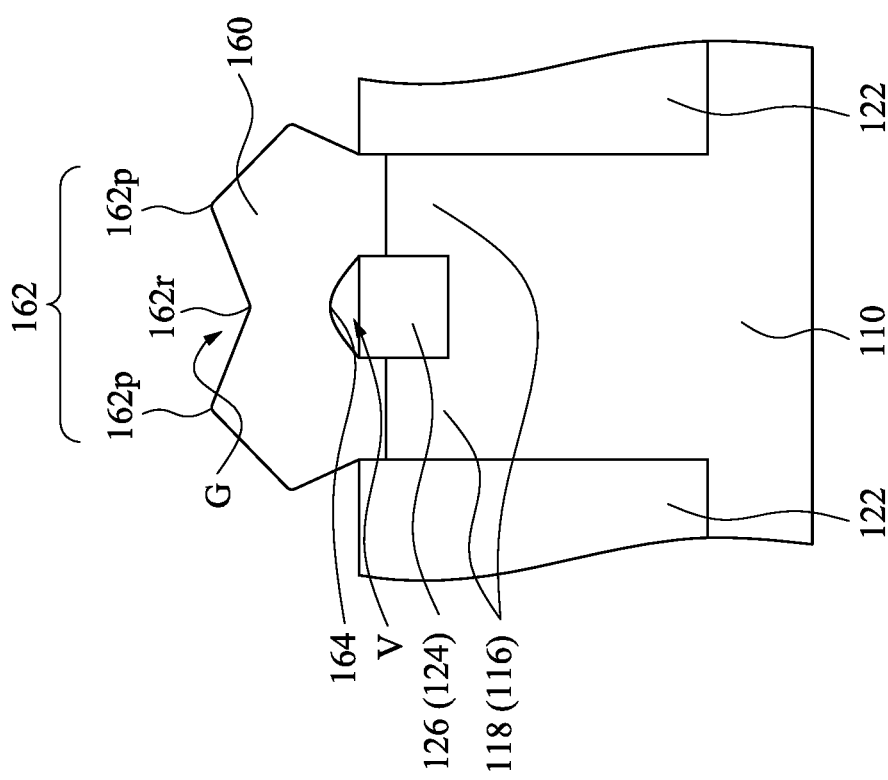

Semiconductor Device and Manufacturing Method Thereof

SEMICONDUCTOR DEVICE AND MANUFACTURING METHOD THEREOF

PRIORITY CLAIM AND CROSS-REFERENCE

This application is a continuation of U.S. patent application Ser. No. 15/883,179, filed on Jan. 30, 2018 and entitled "Semiconductor Device and Manufacturing Method Thereof," which is a continuation of U.S. patent application Ser. No. 14/854,915, filed on Sep. 15, 2015 and entitled "Semiconductor Device and Manufacturing Method Thereof," now U.S. Pat. No. 9,905,641 issued on Feb. 27, 2018, which applications are incorporated herein by reference.

BACKGROUND

Semiconductor devices are used in a large number of electronic devices, such as computers, cell phones, and others. Semiconductor devices include integrated circuits that are formed on semiconductor wafers by depositing many types of thin films of material over the semiconductor wafers, and patterning the thin films of material to form the integrated circuits. Integrated circuits include field-effect transistors (FETs) such as metal oxide semiconductor (MOS) transistors.

In the race to improve transistor performance as well as reduce the size of transistors, transistors have been developed that the channel and source/drain regions are located in a fin formed from the bulk substrate. Such non-planar devices are multiple-gate FinFETs. A multiple-gate FinFET may have a gate electrode that straddles across a fin-like silicon body to form a channel region.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 is a cross-sectional view of a semiconductor device in accordance with some embodiments of the present disclosure.

FIG. 5 is a cross-sectional view of a semiconductor device in accordance with some embodiments of the present disclosure.

DETAILED DESCRIPTION

Figure 1A:
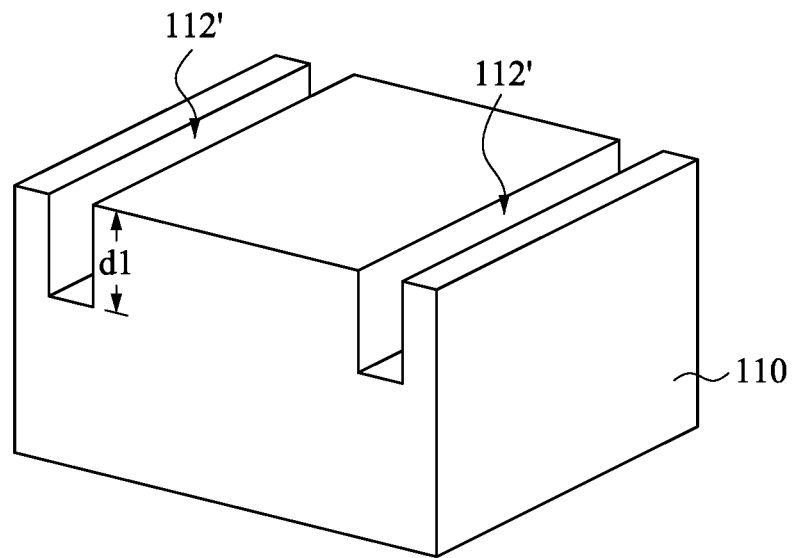
FIGS. 1A to 1F are perspective views of a method for manufacturing a semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A to 1F are perspective views of a method for manufacturing a semiconductor device at various stages in accordance with some embodiments of the present disclosure. Reference is made to FIG. 1A. A substrate 110 is provided. In some embodiments, the substrate 110 may be a semiconductor material and may include known structures including a graded layer or a buried oxide, for example. In some embodiments, the substrate 110 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the substrate 110. Alternatively, the substrate 110 may be an active layer of a semiconductor-on-insulator (SOI) substrate or a multi-layered structure such as a silicon-germanium layer formed on a bulk silicon layer.

At least two trenches 112' are formed in the substrate 110. The trenches 112' may be formed using a masking layer (not shown) along with a suitable etching process. For example, the masking layer may be a hardmask including silicon nitride formed through a process such as chemical vapor deposition (CVD), although other materials, such as oxides, oxynitrides, silicon carbide, combinations of these, or the like, and other processes, such as plasma enhanced CVD (PECVD), low pressure CVD (LPCVD), or even silicon oxide formation followed by nitridation, may alternatively be utilized. Once formed, the masking layer may be patterned through a suitable photolithographic process to expose those portions of the substrate 110 that will be removed to form the trenches 112'.

As one of skill in the art will recognize, however, the processes and materials described above to form the masking layer are not the only method that may be used to protect portions of the substrate 110 while exposing other portions of the substrate 110 for the formation of the trenches 112'. Other suitable process, such as a patterned and developed photoresist, may alternatively be utilized to expose portions of the substrate 110 to be removed to form the trenches 112'. All such methods are fully intended to be included in the scope of the present disclosure.

Once a masking layer has been formed and patterned, the trenches 112' are formed in the substrate 110. The exposed substrate 110 may be removed through a suitable process such as reactive ion etching (RIE) in order to form the trenches 112' in the substrate 110, although other suitable processes may alternatively be used. In some embodiments, the trenches 112' may be formed to have a depth d1 be less than about 500 nm from the surface of the substrate 110, such as about 250 nm. As explained below with respect to FIG. 1B, the area of the substrate 110 between the trenches 112' is subsequently patterned to form individual semiconductor fins.

Figure 1B:
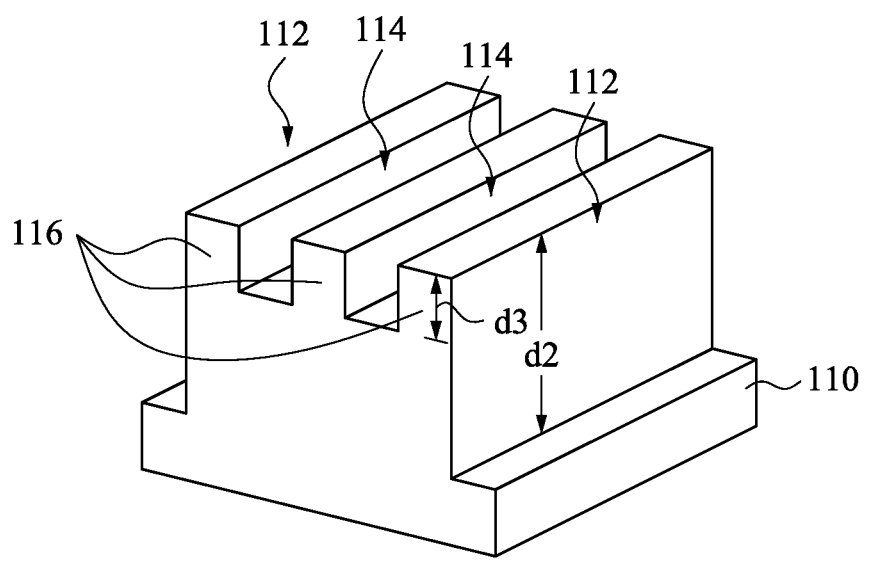

Reference is made to FIG. 1B. For the sake of clarity, FIG. 1B has been enlarged from FIG. 1A to show the interior of the trenches 112' of FIG. 1A. At least one trench 114 is formed between the trenches 112' of FIG. 1A, and the trenches 112' are formed to be trenches 112. For example, in FIG. 1B, two of the trenches 114 are formed between the trenches 112. The trenches 114 can be isolation regions between separate semiconductor fins 116 that share either a similar gate or similar sources or drains. The trenches 112 may be isolation regions located between semiconductor fins that do not share a similar gate, source, or drain.

The trenches 114 may be formed using a similar process as the trenches 112' (discussed above with respect to FIG. 1A) such as a suitable masking or photolithography process followed by an etching process. Additionally, the formation of the trenches 114 is also used to deepen the trenches 112' of FIG. 1A, such that the trenches 112 extend into the substrate 110 a further distance than the trenches 114. That is, the trenches 112 are deeper than the trenches 114. This may be done by using a suitable mask to expose both the trenches 112 as well as those areas of the substrate 110 that will be removed to form the trenches 114. As such, the trenches 112 may have a second depth d2 of between about 20 nm and about 700 nm, such as about 320 nm, and the trenches 114 may be formed to have a third depth d3 of between about 10 nm and about 150 nm, such as about 1000 nm. It is noted that although in FIG. 1B the trenches 112 and 114 have sharp corners, in some other embodiments, the trenches 112 and 114 may have round corners depending on the etching conditions.

However, as one of ordinary skill in the art will recognize, the process described above to form the trenches 112 and 114 is one potential process, and is not meant to be limited with this respect. Rather, other suitable process through which the trenches 112 and 114 may be formed such that the trenches 112 extend into the substrate 110 further than the trenches 114 may be utilized. For example, the trenches 112 may be formed in a single etch step and then protected during the formation of the trenches 114. Other suitable process, including any number of masking and removal processes may alternatively be used.

In addition to forming the trenches 114, the masking and etching process additionally forms the semiconductor fins 116 from those portions of the substrate 110 that remain unremoved. These semiconductor fins 116 may be used, as discussed below, to form the channel region of the semiconductor device. While FIG. 1B illustrates three semiconductor fins 116 formed from the substrate 110, any number of semiconductor fins 116 that are greater than one may be utilized such that there are the trenches 112 and 114. In some embodiments, the semiconductor fins 116 may form a separate channel region while still being close enough to share a common gate (whose formation is discussed below in relation to FIG. 1D).

Figure 1C:
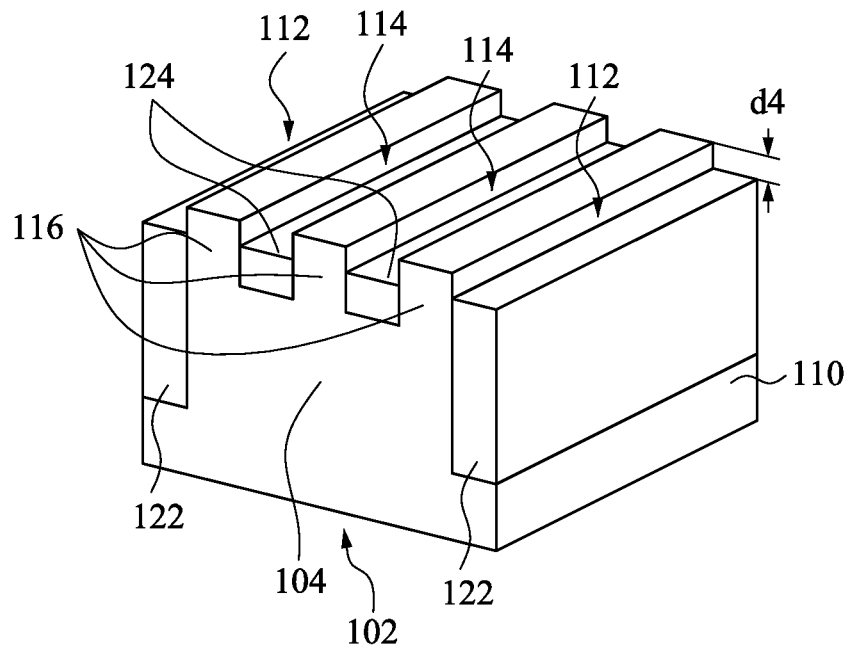

Reference is made to FIG. 1C. The trenches 112 and 114 are filled with a dielectric material (not shown). The dielectric material is recessed within the trenches 112 and 114 to respectively form isolation structures 122 (referred as second isolation structures or inter-device isolation structures) and 124 (referred as first isolation structures or intra-device isolation structures). In some embodiments, the isolation structures 122 extend into the substrate 110 further than the isolation structures 124. In other words, the isolation structures 122 are deeper than the isolation structures 124. The isolation structures 122 define a crown structure (or a crown active region) 102 in the substrate 110, and the isolation structures 124 define a plurality of the semiconductor fins 116 in the crown structure 102. In greater detail, the crown structure (or the crown active region) 102 includes the semiconductor fins 116, the isolation structure 124, and a continuous semiconductor region 104. The continuous semiconductor region 104 is underlying the semiconductor fins 116 and the isolation structure 124. The dielectric material may be an oxide material, a high-density plasma (HDP) oxide, or the like. The dielectric material may be formed, after an optional cleaning and lining of the trenches 112 and 114, using either a CVD method (e.g., the high aspect ratio process (HARP) process), a high density plasma CVD method, or other suitable method of formation as is known in the art.

The trenches 112 and 114 may be filled by overfilling the trenches 112 and 114 and the substrate 110 with the dielectric material and then removing the excess material outside of the trenches 112 and 114 and substrate 110 through a suitable process such as chemical mechanical polishing (CMP), an etch, a combination of these, or the like. In some embodiments, the removal process removes any dielectric material that is located over the substrate 110 as well, so that the removal of the dielectric material will expose the surface of the substrate 110 to further processing operations.

Once the trenches 112 and 114 have been filled with the dielectric material, the dielectric material may then be recessed away from the surface of the substrate 110. The recessing may be performed to expose at least a portion of the sidewalls of the semiconductor fins 116 adjacent to the top surface of the substrate 110. The dielectric material may be recessed using a wet etch by dipping the top surface of the substrate 110 into an etchant such as HF, although other etchants, such as $H_2$, and other methods, such as a reactive ion etch, a dry etch with etchants such as $NH_3/NF_3$, chemical oxide removal, or dry chemical clean may alternatively be used. The dielectric material may be recessed to a fourth depth d4 from the surface of the substrate 110 of between about 5 nm and about 50 nm, such as about 40 nm. Additionally, the recessing may also remove any leftover dielectric material located over the substrate 110 to ensure that the substrate 110 is exposed for further processing.

As one of ordinary skill in the art will recognize, however, the steps described above may be only part of the overall process flow used to fill and recess the dielectric material. For example, lining steps, cleaning steps, annealing steps, gap filling steps, combinations of these, and the like may also be utilized to form and fill the trenches 112 and 114 with the dielectric material. All of the potential process steps are fully intended to be included within the scope of the present embodiment.

Figure 1D:
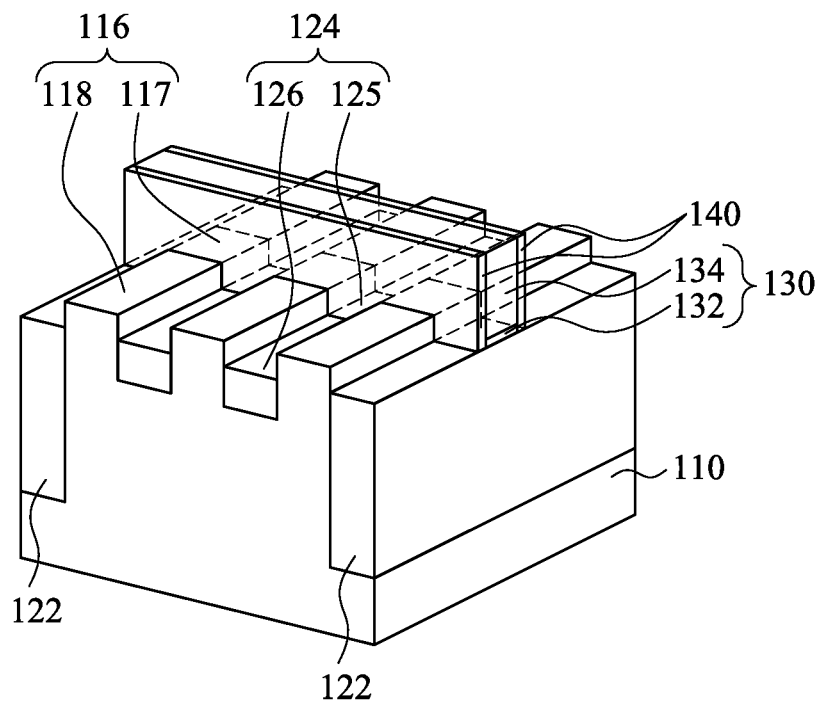

Reference is made to FIG. 1D. A gate stack 130 is formed on a portion of the semiconductor fins 116 and the isolation structures 122 and 124. The gate stack 130 includes a gate dielectric 132 and a gate electrode 134. The gate dielectric 132 may be formed by thermal oxidation, chemical vapor deposition, sputtering, or any other methods known and used in the art for forming a gate dielectric. Depending on the technique of gate dielectric formation, a thickness of the gate dielectric 132 on the top of the semiconductor fins 116 may be different from a thickness of the gate dielectric 132 on the sidewall of the semiconductor fins 116.

The gate dielectric 132 may includes a material such as silicon dioxide or silicon oxynitride with a thickness ranging from about 3 angstroms to about 100 angstroms, such as about 10 angstroms. The gate dielectric 132 may alternatively be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of about 0.5 angstroms to about 100 angstroms, such as about 10 angstroms or less. Additionally, combinations of silicon dioxide, silicon oxynitirde, and/or high-k materials may also be used for the gate dielectric 132.

The gate electrode 134 is formed on the gate dielectric 132. The gate electrode 134 may include a conductive material and may be selected from a group including of polycrystalline-silicon (poly-Si), poly-crystalline silicon-germanium (poly-SiGe), metallic nitrides, metallic silicides, metallic oxides, metals, combinations of these, and the like. Examples of metallic nitrides include tungsten nitride, molybdenum nitride, titanium nitride, and tantalum nitride, or their combinations. Examples of metallic silicide include tungsten silicide, titanium silicide, cobalt silicide, nickel silicide, platinum silicide, erbium silicide, or their combinations. Examples of metallic oxides include ruthenium oxide, indium tin oxide, or their combinations. Examples of metal include tungsten, titanium, aluminum, copper, molybdenum, nickel, platinum, etc.

The gate electrode 134 may be deposited by chemical vapor deposition (CVD), sputter deposition, or other techniques known and used in the art for depositing conductive materials. The thickness of the gate electrode 134 may be in the range of about 200 angstroms to about 4,000 angstroms. Ions may or may not be introduced into the gate electrode 134 at this process. Ions may be introduced, for example, by ion implantation techniques.

The gate stack 130 defines multiple channel regions (i.e., first portions 117) located in the semiconductor fins 116 underneath the gate dielectric 132. The gate stack 130 may be formed by depositing and patterning a gate mask (not shown) on a gate electrode layer using, for example, deposition and photolithography techniques known in the art. The gate mask may incorporate commonly used masking materials, such as (but not limited to) photoresist material, silicon oxide, silicon oxynitride, and/or silicon nitride. A dry etching process may be used to form the patterned gate stack 130.

Once gate stack 130 is patterned, a pair of spacers 140 may be formed. The spacers 140 may be formed on opposing sides of the gate stack 130. The spacers 130 are typically formed by blanket depositing a spacer layer (not shown) on the previously formed structure. The spacer layer may include SiN, oxynitride, SiC, SiON, oxide, and the like and may be formed by methods utilized to form such a layer, such as chemical vapor deposition (CVD), plasma enhanced CVD, sputter, and other methods known in the art. The spacer layer may include a different material with different or the similar etch characteristics than the dielectric material of isolation structures 122 and 124. The spacers 140 may then be patterned, such as by one or more etches to remove the spacer layer from the horizontal surfaces of the structure.

In FIG. 1D, at least one of the semiconductor fins 116 has at least one first portion 117 and at least one second portion 118. The gate stack 130 and the spacers 140 cover the first portion 117 while leaving the second portion(s) 118 uncovered. That is, the second portion(s) 118 is exposed by the gate stack 130 and the spacers 140. Moreover, at least one of the isolation structures 124 has at least one first portion 125 and at least one second portion 126. The gate stack 130 and the spacers 140 cover the first portion 125 while leaving the second portion(s) 126 uncovered. That is, the second portion(s) 126 is exposed by the gate stack 130 and the spacers 140.

Figure 1E:
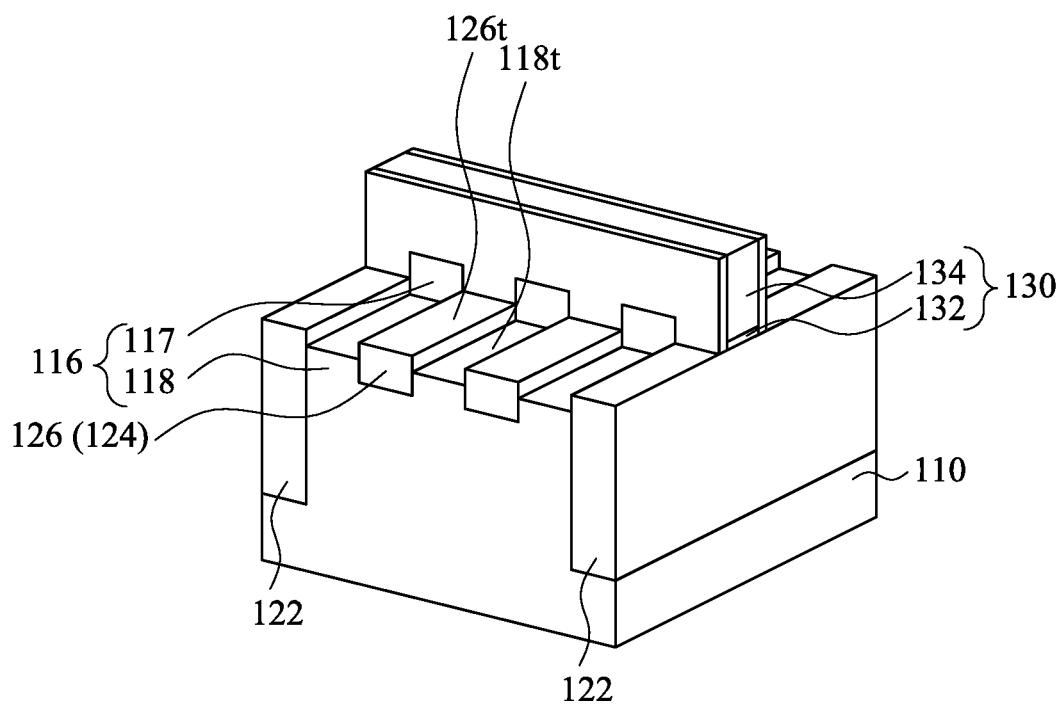

Reference is made to FIG. 1E. Parts of the second portions 118 of the semiconductor fins 116 are removed from those areas not protected by the gate stack 130 and spacers 140. Top surfaces 118$t$ of the remaining second portions 118 of the semiconductor fins 116 are below the top surfaces 126$t$ of the second portions 126 of the isolation structure 124. This removal may be performed by a reactive ion etch (RIE) using the gate stacks 130 and first spacers 140 as hardmasks, or by any other suitable removal process. In some embodiments, the etching process may be performed under a pressure of about 1 mTorr to 1000 mTorr, a power of about 50 W to 1000 W, a bias voltage of about 20 V to 500 V, at a temperature of about 40° C. to 60° C., using a HBr and/or $Cl_2$ as etch gases. Also, in the embodiments provided, the bias voltage used in the etching process may be tuned to allow good control of an etching direction to achieve desired profiles for the remaining (or recessed) second portions 118 of the semiconductor fins 116. It is noted that although in FIG. 1E the remaining second portions 118 have sharp corners, in some other embodiments, the remaining second portions 118 may have round corners depending on the etching conditions.

Figure 1F:
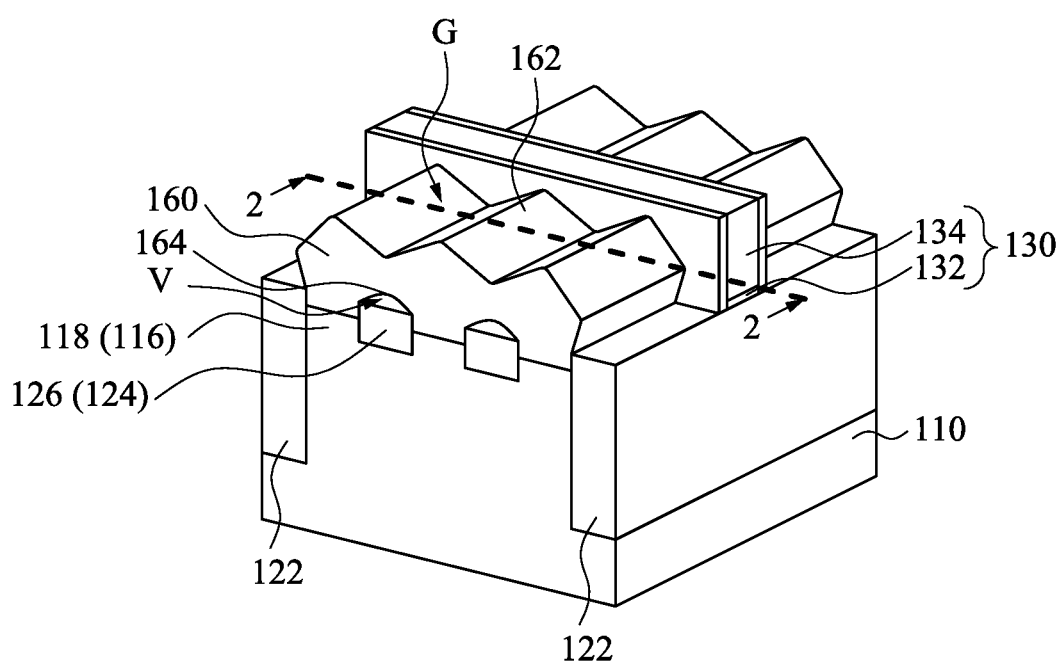
Figure 2:
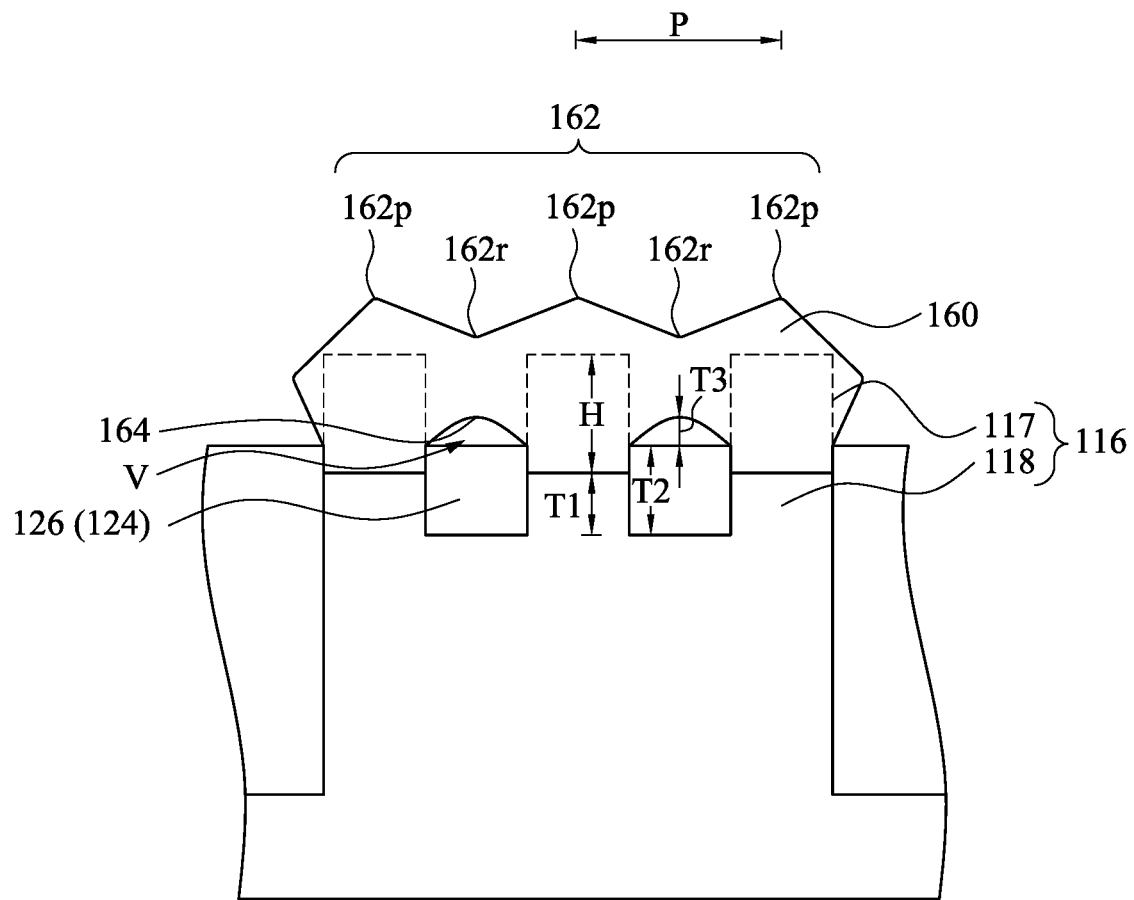
FIG. 2 is a cross-sectional view taking along line 2-2 of FIG. 1F.

Reference is made to FIGS. 1F and 2, and FIG. 2 is a cross-sectional view taking along line 2-2 of FIG. 1F. An epitaxy structure 160 is formed on the remaining second portions 118 of the semiconductor fins 116 and above the second portions 126 of the isolation structures 124, leaving at least one void V on the second portions 126 of the isolation structures 124. For example, in FIGS. 1F and 2, the epitaxy structure 160 leaves two voids V respectively on the second portions 126 of the isolation structures 124. Since the lattice constant of the epitaxy structure 160 is different from the substrate 110, the channel regions of the semiconductor fins 116 are strained or stressed to enable carrier mobility of the device and enhance the device performance. In some embodiments, the epitaxy structure 160, such as silicon carbon (SiC), is epi-grown by a LPCVD process to form source and drain regions of an n-type FinFET. The LPCVD process is performed at a temperature of about 400° C. to 800° C. and under a pressure of about 1 to 200 Torr, using $Si_3H_8$ and $SiH_3CH$ as reaction gases. In some embodiments, the epitaxy structure 160, such as silicon germanium (SiGe), is epi-grown by a LPCVD process to form source and drain regions of a p-type FinFET. The LPCVD process is performed at a temperature of about 400° C. to 800° C. and under a pressure of about 1 to 200 Torr, using $SiH_4$ and $GeH_4$ as reaction gases.

The epitaxy structure 160 has a top surface 162. At least one portion of the top surface 162 of the epitaxy structure 160 is recessed. That is, the top surface 162 of the epitaxy structure 160 has at least one recessed surface portion 162$r$. Moreover, the top surface 162 further has at least one peak portion 162$p$. The recessed surface portion 162$r$ is local minimum of the top surface 162, and the peak portion 162p is a local maximum of the top surface 162. For example, in FIGS. 1F and 2, the top surface 162 has two of the recessed surface portions 162r and three of the peak portions 162p. The recessed surface portions 162r are respectively located above the second portions 126 of the isolation structures 124 to respectively form grooves G in the epitaxy structure 160. Therefore, the top surface 162 is a wavy surface.

In FIGS. 1F and 2, the epitaxy structure 160 has a bottom surface 164 adjacent to the voids V. At least one portion of the bottom surface 164 of the epitaxy structure 160 is recessed to form the void V. In FIGS. 1F and 2, the bottom surface 164 of the epitaxy structure 160 is recessed to form the two voids V. Therefore, the bottom surface 164 is a wavy surface. The voids V is disposed on the second portions 126 of the isolation structures 124, separating the epitaxy structure 160 and the second portions 126. The second portions 126 of the isolation structures 124 are respectively disposed between the epitaxy structure 160 and the substrate 110. In some embodiments, the voids V are air voids (or air gaps), whose permittivity is about 1. The permittivity difference between the epitaxy structure 160 and the voids V can achieve good alternate current (AC) performance.

In some embodiments, at least one of the second portions 118 of the semiconductor fins 116 has a thickness T1 in a range of about 5 nm to about 13 nm. At least one of the second portions 126 of the isolation structures 124 has a thickness T2 in a range of about 5 nm to about 20 nm. At least one of the voids V has a thickness T3 greater than about 4 nm. A pitch P of adjacent two of the semiconductor fins 116 (i.e., substantially equals to a pitch of adjacent two of the peak portions 162p) is substantially smaller than 40 nm. A height difference H between the first portion 117 and the second portion 118 of the semiconductor fin 116 is in a range of about 30 nm to about 55 nm.

In some embodiments, after the process of FIG. 1F, a contact (not shown) can be formed on the epitaxy structure 160 to interconnect the epitaxy structure 160 and overlaying structures of the semiconductor device. In some embodiments, the contact is made of metal, and the claim is not limited in this respect. In FIGS. 1F and 2, since the epitaxy structure 160 has the recessed (wavy) top surface 162, the contact area of the contact and the epitaxy structure 160 can be increased, thereby reducing the junction contact resistance, and improve the performance of the semiconductor device. Moreover, since at least one of the second portions 118 of the semiconductor fins 116 is disposed between the isolation structures 122 and 124, and the second portions 118, the isolation structures 122 and 124 together form a recess, the (lateral) regrowth of the epitaxy structure 160 can be constrained in the recess. Thus, the growth dislocation problem of the epitaxy structure 160 can be improved. Furthermore, due to the isolation structures 124, the current leakage problem of the semiconductor fins 116 and the epitaxy structure 160 can be improved. In addition, the permittivity difference between the epitaxy structure 160 and the voids V can achieve good alternate current (AC) performance.

Figure 3:
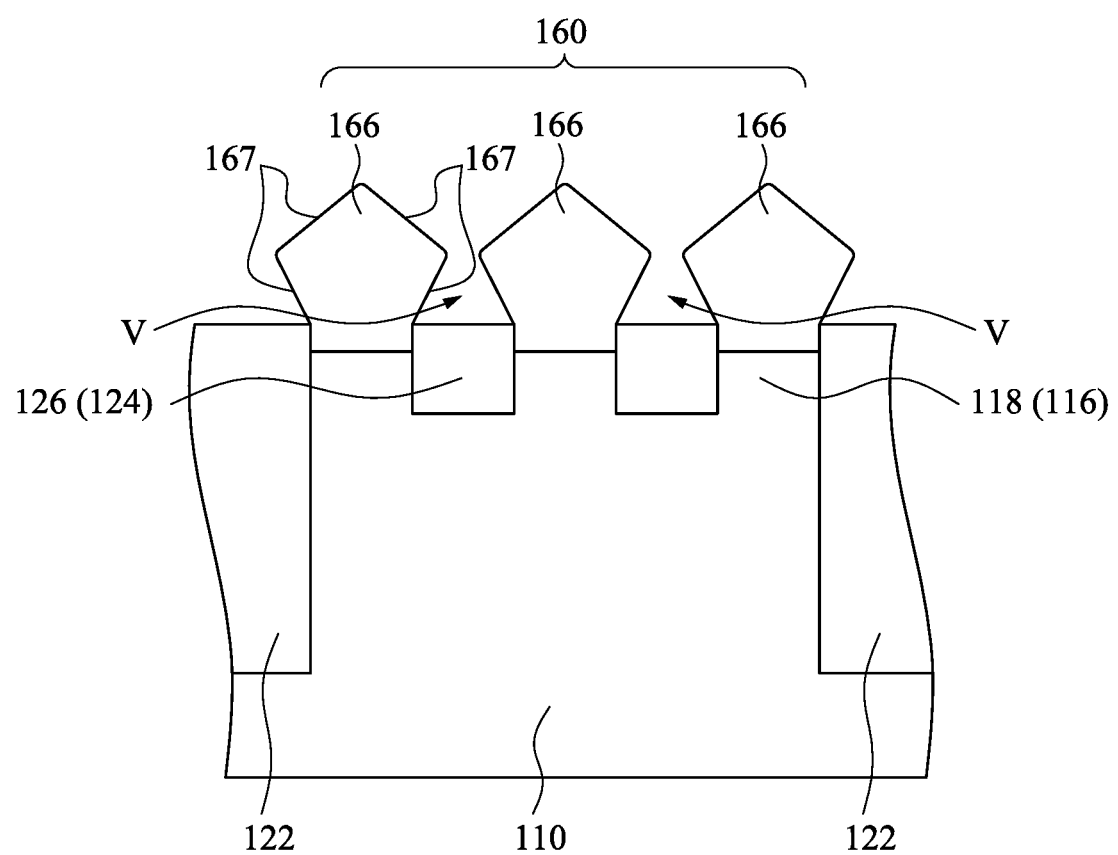
FIG. 3 is a cross-sectional view of a semiconductor device in accordance with some embodiments of the present disclosure.

FIG. 3 is a cross-sectional view of a semiconductor device in accordance with some embodiments of the present disclosure. The difference between the semiconductor devices of FIGS. 3 and 2 pertains to the shapes of the epitaxy structure 160. In FIG. 3, the epitaxy structure 160 includes a plurality of epitaxy portions 166 spaced from each other and respectively disposed on the semiconductor fins 116. For example, in FIG. 3, the epitaxy structure 160 includes three epitaxy portions 166. The epitaxy portions 166 are facet shaped. In greater detail, due to different growth rates on different surface planes, facets may be formed on the epitaxy portions 166. For example, the growth rate on surfaces having (111) surface orientations (referred to as (111) planes) is lower than that on other planes, such as (110) and (100) planes. Accordingly, facets 167 are formed as a result of the difference in the growth rates of different planes. If the epitaxy portions 166 are grown freely, the facets 167 will have the (111) surface orientations (in other word, on (111) planes). Therefore, with the proceeding of the epitaxial growth, due to the difference in growth rates, facets 167 are gradually formed.

In FIG. 3, a void V is formed between adjacent two of the epitaxy portions 166 and on the second portions 126 of the isolation structure 124. The void V can be an air void. The permittivity difference between the epitaxy structure 160 and the voids V can achieve good alternate current (AC) performance. Moreover, the shape difference between the epitaxy structure 160 of FIGS. 3 and 2 depends on, for example, the epitaxial growth conditions, and the claimed scope is not limited in this respect. Other relevant structural details of the semiconductor device in FIG. 3 are similar to the semiconductor device in FIG. 2, and, therefore, a description in this regard will not be repeated hereinafter.

FIG. 4 is a cross-sectional view of a semiconductor device in accordance with some embodiments of the present disclosure. The difference between the semiconductor devices of FIGS. 4 and 2 pertains to the number of the semiconductor fins 116 and the shape of the epitaxy structure 160. In FIG. 4, the substrate 110 has two semiconductor fins 116, and the isolation structure 124 is disposed therebetween. The top surface 162 of the epitaxy structure 160 has one recessed surface portion 162r and two peak portions 162p. The recessed surface portion 162r is formed between the two peak portions 162p. The recessed surface portion 162r is located above the second portions 126 of the isolation structures 124 to form a groove G in the epitaxy structure 160. Therefore, the top surface 162 is a wavy surface. Moreover, a void V is formed on the second portion 126 of the isolation structure 124 and between the epitaxy structure 160 and the second portion 126. The semiconductor devices having two semiconductor fins 116 can be applied to an n-type metal-oxide-semiconductor (MOS) device, while the semiconductor devices having three semiconductor fins 116 as shown in FIGS. 2 and 3 can be applied to a p-type MOS device, and the claimed scope is not limited in this respect. Other relevant structural details of the semiconductor device in FIG. 4 are similar to the semiconductor device in FIG. 2, and, therefore, a description in this regard will not be repeated hereinafter.

FIG. 5 is a cross-sectional view of a semiconductor device in accordance with some embodiments of the present disclosure. The difference between the semiconductor devices of FIGS. 5 and 3 pertains to the number of the semiconductor fins 116. In FIG. 5, the substrate 110 has two semiconductor fins 116, and the isolation structure 124 is disposed therebetween. The epitaxy structure 160 includes two epitaxy portions 166 spaced from each other and respectively disposed on the two semiconductor fins 116. The epitaxy portions 166 are facet shaped. In FIG. 5, facets 167 are formed as a result of the difference in the growth rates of different planes. If the epitaxy portions 166 are grown freely, the facets 167 will have the (111) surface orientations (in other word, on (111) planes). Therefore, with the proceeding of the epitaxial growth, due to the difference in growth rates, facets 167 are gradually formed. Furthermore, a void V is formed between the two epitaxy portions 166 and on the second portions 126 of the isolation structure 124 to improve the AC performance of the semiconductor device. The semiconductor device in FIG. 5 can be applied to an nMOS device, and the claimed scope is not limited in this respect. Other relevant structural details of the semiconductor device in FIG. 5 are similar to the semiconductor device in FIG. 3, and, therefore, a description in this regard will not be repeated hereinafter.

Figure 6A:
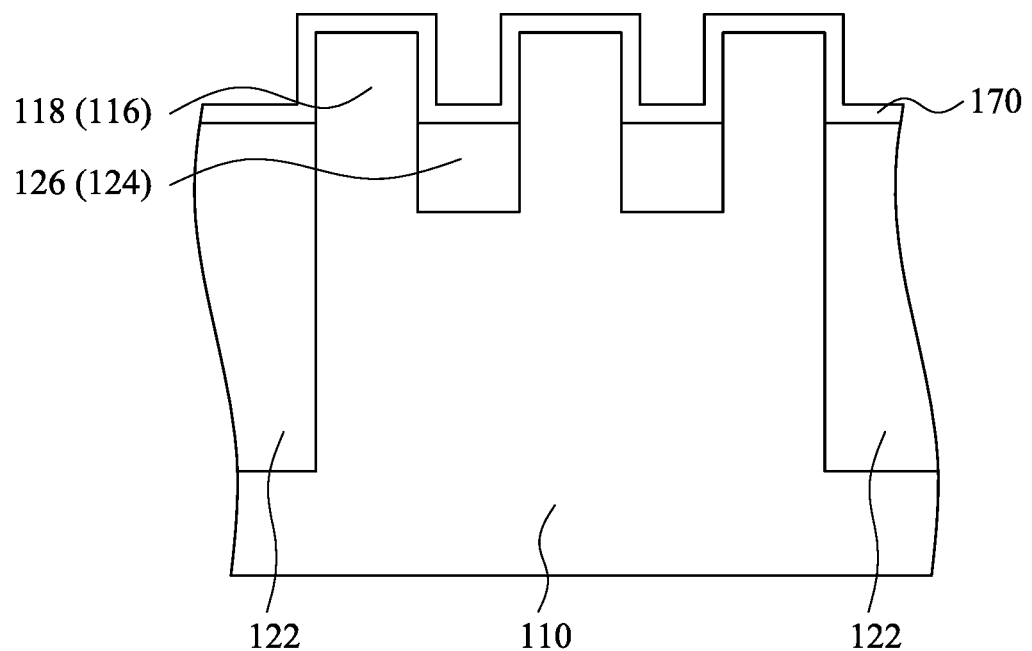
FIGS. 6A to 6C are cross-sectional views of a method for manufacturing a semiconductor device at various stages in accordance with some embodiments of the present disclosure.
Figure 6B:
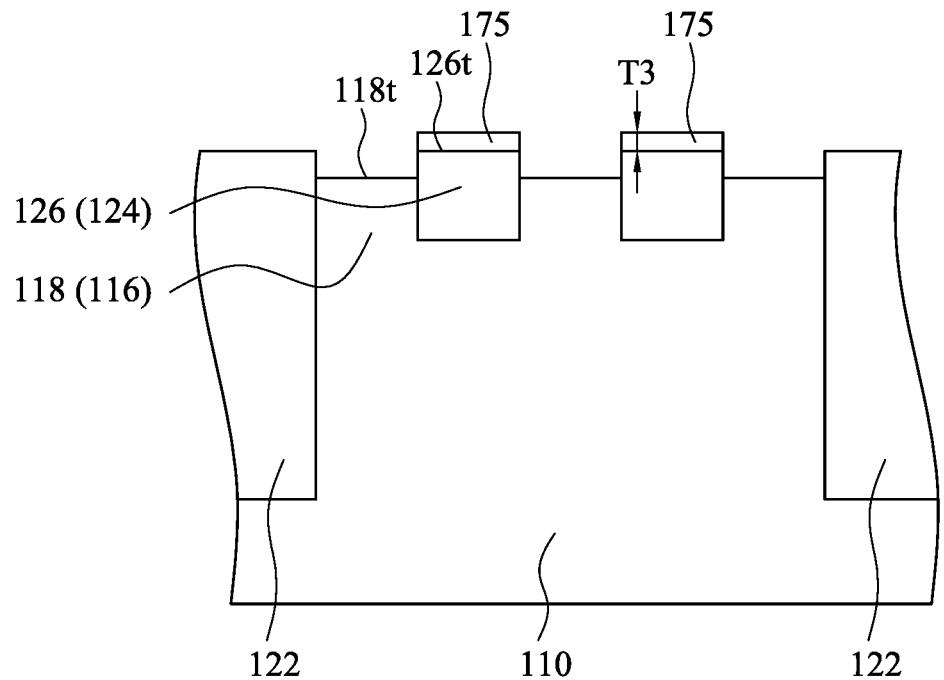
Figure 6C:
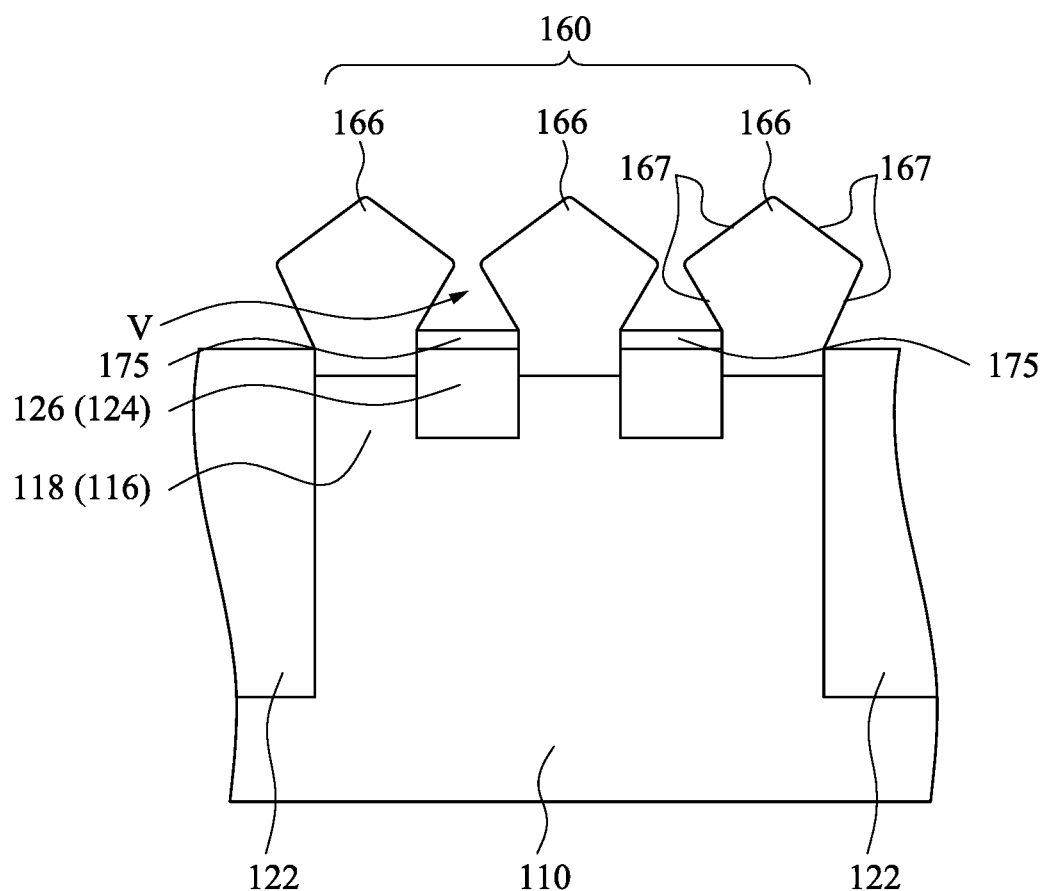

FIGS. 6A to 6C are cross-sectional views of a method for manufacturing a semiconductor device at various stages in accordance with some embodiments of the present disclosure. The cross-sectional positions of FIGS. 6A to 6C are similar to the cross-sectional position of FIG. 1F. The manufacturing processes of FIGS. 1A-1D are performed in advance. Since the relevant manufacturing details are similar to the abovementioned embodiment, and, therefore, a description in this regard will not be repeated hereinafter. Reference is made to FIG. 6A. Subsequently, a sidewall layer 170 is formed along the semiconductor fins 116. The sidewall layer 170 may include a dielectric material such as silicon oxide. Alternatively, the sidewall layer 170 may include silicon nitride, SiC, SiON, or combinations thereof. In some embodiments, the sidewall layer 170 can be formed with the spacers 140 (see FIG. 1D), or formed in an additional process, and the claimed scope is not limited in this respect.

Reference is made to FIG. 6B. Parts of the second portions 118 of the semiconductor fins 116 are removed from those areas not protected by the gate stack 130 and spacers 140. Also, parts of the sidewall layer 170 are removed to form a plurality of sidewall structures 175 on the second portions 126 of the isolation structures 124. Top surfaces 118t of the remaining second portions 118 of the semiconductor fins 116 are below the top surfaces 126t of the second portions 126 of the isolation structure 124. This removal may be performed by a reactive ion etch (RIE) using the gate stacks 130 and first spacers 140 (see FIG. 1D) as hardmasks, or by any other suitable removal process. In some embodiments, the etching process may be performed under a pressure of about 1 mTorr to 1000 mTorr, a power of about 50 W to 1000 W, a bias voltage of about 20 V to 500 V, at a temperature of about 40° C. to 60° C., using a HBr and/or $Cl_2$ as etch gases. Also, in the embodiments provided, the bias voltage used in the etching process may be tuned to allow good control of an etching direction to achieve desired profiles for the remaining (or recessed) second portions 118 of the semiconductor fins 116. It is noted that although in FIG. 6B the remaining second portions 118 have sharp corners, in some other embodiments, the remaining second portions 118 may have round corners depending on the etching conditions.

In FIG. 6B, during the etching process, since the ions or etchants for etching is not easy to enter the gaps between the semiconductor fins 116, the etching thickness of the sidewall layer 170 (see FIG. 6A) between the semiconductor fins 116 are less than other portions. Therefore, in some embodiments, portions of the sidewall layer 170 on the isolation structures 122 can be removed while the sidewall structures 175 remain on the isolation structures 124. However, in some other embodiments, portions of the sidewall layer 170 may remain on the isolation structures 122 and have a thickness smaller than the sidewall structures 175. In some embodiments, the thickness of the sidewall structures 175 can be greater than 3 nm.

Reference is made to FIG. 6C. An epitaxy structure 160 is formed on the remaining second portions 118 of the semiconductor fins 116 and above the second portions 126 of the isolation structures 126, leaving at least one void V on the second portions 126 of the isolation structures 124. For example, in FIG. 6C, the epitaxy structure 160 leaves two voids V respectively on the second portions 126 of the isolation structures 124. Since the lattice constant of the epitaxy structure 160 is different from the substrate 110, the channel regions of the semiconductor fins 116 are strained or stressed to enable carrier mobility of the device and enhance the device performance. In some embodiments, the epitaxy structure 160, such as silicon carbon (SiC), is epi-grown by a LPCVD process to form source and drain regions of an n-type FinFET. The LPCVD process is performed at a temperature of about 400° C. to 800° C. and under a pressure of about 1 to 200 Torr, using $Si_3H_8$ and $SiH_3CH$ as reaction gases. In some embodiments, the epitaxy structure 160, such as silicon germanium (SiGe), is epi-grown by a LPCVD process to form source and drain regions of a p-type FinFET. The LPCVD process is performed at a temperature of about 400° C. to 800° C. and under a pressure of about 1 to 200 Torr, using $SiH_4$ and $GeH_4$ as reaction gases.

In FIG. 6C, the epitaxy structure 160 includes a plurality of epitaxy portions 166 spaced from each other and respectively disposed on the semiconductor fins 116. For example, in FIG. 6C, the epitaxy structure 160 includes three epitaxy portions 166. The sidewall structures 175 are respectively disposed between the epitaxy portions 166 to adjust the profile of the epitaxy portions 166. The epitaxy portions 166 are facet shaped. In greater detail, due to different growth rates on different surface planes, facets may be formed on the epitaxy portions 166. For example, the growth rate on surfaces having (111) surface orientations (referred to as (111) planes) is lower than that on other planes, such as (110) and (100) planes. Accordingly, facets 167 are formed as a result of the difference in the growth rates of different planes. If the epitaxy portions 166 are grown freely, the facets 167 will have the (111) surface orientations (in other word, on (111) planes). Therefore, with the proceeding of the epitaxial growth, due to the difference in growth rates, facets 167 are gradually formed. Moreover, a void V is formed between adjacent two of the epitaxy portions 166 and on the second portions 126 of the isolation structure 124 to improve AC performance of the semiconductor device. Other relevant structural details of the semiconductor device in FIG. 6C are similar to the semiconductor device in FIG. 2, and, therefore, a description in this regard will not be repeated hereinafter.

Figure 7:
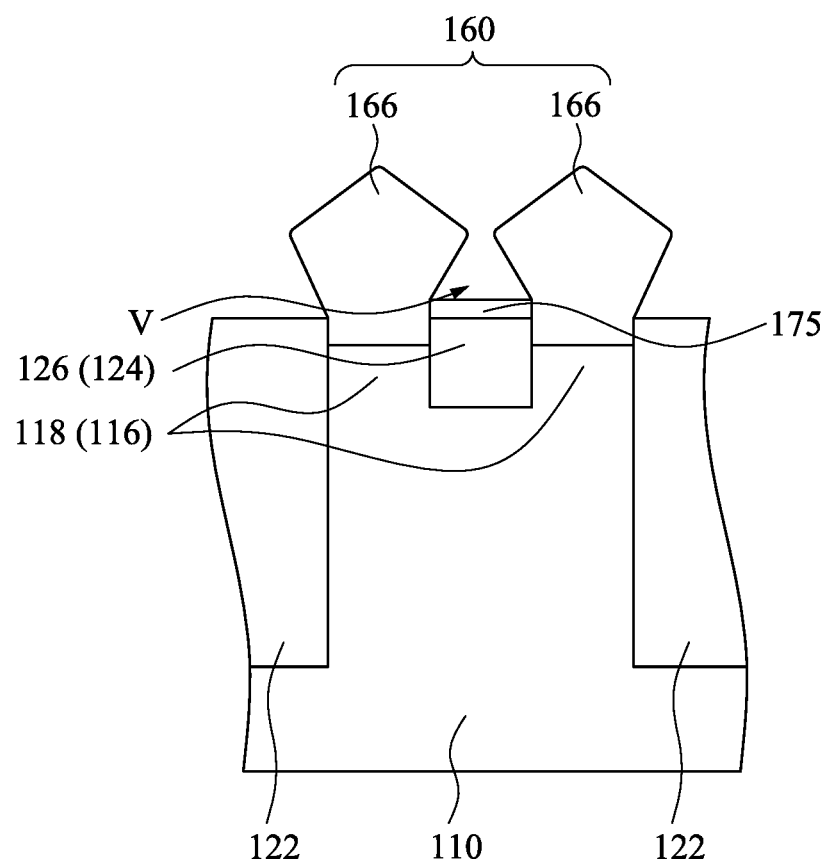
FIG. 7 is a cross-sectional view of a semiconductor device in accordance with some embodiments of the present disclosure.

FIG. 7 is a cross-sectional view of a semiconductor device in accordance with some embodiments of the present disclosure. The difference between the semiconductor devices of FIGS. 7 and 6C pertains to the number of the semiconductor fins 116. In FIG. 7, the substrate 110 has two semiconductor fins 116, and the isolation structure 124 and the sidewall structure 175 are disposed therebetween. The epitaxy structure 160 includes two epitaxy portions 166 spaced from each other and respectively disposed on the two semiconductor fins 116. The epitaxy portions 166 are facet shaped. Furthermore, a void V is formed between the two epitaxy portions 166 and on the second portions 126 of the isolation structure 124 to improve the AC performance of the semiconductor device. The semiconductor device in FIG. 7 can be applied to an n-type MOS device, and the claimed scope is not limited in this respect. Other relevant structural details of the semiconductor device in FIG. 7 are similar to the semiconductor device in FIG. 6C, and, therefore, a description in this regard will not be repeated hereinafter.

According to the aforementioned embodiments, since the epitaxy structure has the recessed (wavy) top surface, the contact area of a contact and the epitaxy structure can be increased, thereby reducing the junction contact resistance, and improve the performance of the semiconductor device. Moreover, since at least one of the second portions of the semiconductor fins is disposed between the isolation structures, and the second portions and the isolation structures together form a recess, the (lateral) regrowth of the epitaxy structure can be constrained in the recess. Thus, the growth dislocation problem of the epitaxy structure can be improved. Furthermore, due to the isolation structures disposed between the semiconductor fins, the current leakage problem of the semiconductor fins and the epitaxy structure can be improved. In addition, the permittivity difference between the epitaxy structure and the voids can achieve good alternate current (AC) performance.

According to some embodiments, a semiconductor device includes a substrate, at least one first isolation structure, at least two second isolation structure, and an epitaxy structure. The substrate has a plurality of semiconductor fins therein. The first isolation structure is disposed between the semiconductor fins. The semiconductor fins are disposed between the second isolation structures, and the second isolation structures extend into the substrate further than the first isolation structure. The epitaxy structure is disposed on the semiconductor fins. At least one void is present between the first isolation structure and the epitaxy structure.

According to some embodiments, a semiconductor device includes a plurality of inter-device isolation structures, at least one crown active region, and an epitaxy structure. The crown active region is disposed between the inter-device isolation structures, and the crown active region includes a plurality of semiconductor fins, at least one intra-device isolation structure, and a continuous semiconductor region. The intra-device isolation structure is disposed between the semiconductor fins. The continuous semiconductor region is underlying the semiconductor fins and the intra-device isolation structure. The epitaxy structure is disposed on the semiconductor fins. At least one air gap is present between the intra-device isolation structure and the epitaxy structure.

According to some embodiments, a method for manufacturing a semiconductor device includes forming at least one first isolation structure and a plurality of second isolation structures in a substrate. The second isolation structures define a crown structure in the substrate, and the first isolation structure defines a plurality of semiconductor fins in the crown structure. A gate stack is formed overlaying first portions of the semiconductor fins and a first portion of the first isolation structure while leaving second portions of the semiconductor fins and a second portion of the first isolation structure exposed. Parts of the second portions of the semiconductor fins are removed. An epitaxy structure is formed on the remaining second portions of the semiconductor fins. The epitaxy structure leaves a void on the second portion of the first isolation structure.

In an embodiment, a semiconductor device includes a plurality of inter-device isolation structures; and a crown active region disposed between the plurality of inter-device isolation structures, where the crown active region includes a first semiconductor fin and a second semiconductor fin immediately adjacent to the first semiconductor fin; an intra-device isolation structure disposed between the first semiconductor fin and the second semiconductor fin; an epitaxy structure including a first portion on the first semiconductor fin and a second portion on the second semiconductor fin, where a bottommost surface of the epitaxial structure is below a top surface of the intra-device isolation structure, where an air gap is between the intra-device isolation structure and the epitaxy structure; and a dielectric layer on the intra-device isolation structure, the dielectric layer extending continuously along the top surface of the intra-device isolation structure from a first sidewall of the first portion of the epitaxy structure to a second sidewall of the second portion of the epitaxy structure facing the first sidewall.

In an embodiment, a method for manufacturing a semiconductor device includes forming a first isolation structure and a plurality of second isolation structures in a substrate, where the plurality of second isolation structures define a crown structure in the substrate, and the first isolation structure defines a plurality of semiconductor fins in the crown structure; forming a gate stack over the plurality of semiconductor fins; forming a dielectric layer over upper surfaces of the plurality of second isolation structures, over an upper surface of the first isolation structure, and over upper surfaces of the plurality of semiconductor fins; performing an etching process, where the etching process removes portions of the dielectric layer to expose the upper surfaces of the plurality of second isolation structures and the upper surfaces of the plurality of semiconductor fins, where after the etching process, a remaining portion of the dielectric layer covers an entire upper surface of the first isolation structure; and forming an epitaxy structure on the plurality of semiconductor fins, where the epitaxy structure leaves at least one void over the first isolation structure.

In an embodiment, a method for manufacturing a semiconductor device includes forming a crown structure over a substrate; forming semiconductor fins in the crown structure; forming an intra-device isolation region between the semiconductor fins and forming inter-device isolation regions on opposing sides of the crown structure; forming a gate structure over the semiconductor fins; forming a dielectric layer that extends continuously over the inter-device isolation regions, the semiconductor fins and the intra-device isolation region; performing an etching process to reduce a thickness of the dielectric layer, where after the etching process, upper surfaces of the inter-device isolation regions and upper surfaces of the semiconductor fins are exposed while an upper surface of the intra-device isolation region is covered by a remaining portion of the dielectric layer; and forming an epitaxial structure over the exposed upper surfaces of the semiconductor fins, where after the epitaxial structure is formed, there is a void between the epitaxial structure and the intra-device isolation region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a substrate;
   inter-device isolation structures over the substrate; and
   a crown active region between the inter-device isolation structures, wherein the crown active region comprises:

a first semiconductor fin and a second semiconductor fin adjacent to the first semiconductor fin;

an intra-device isolation structure between the first semiconductor fin and the second semiconductor fin;

a source/drain structure comprising a first portion on the first semiconductor fin and comprising a second portion on the second semiconductor fin, wherein an air gap is between the intra-device isolation structure and the source/drain structure; and a dielectric layer on the intra-device isolation structure, the dielectric layer physically contacting and extending continuously along an upper surface of the intra-device isolation structure from the first portion of the source/drain structure to the second portion of the source/drain structure, wherein upper surfaces of the inter-device isolation structures distal from the substrate and proximate to the crown active region are free of the dielectric layer.

2. The semiconductor device of claim 1, wherein a first thickness of the intra-device isolation structure is smaller than a second thickness of the inter-device isolation structures.

3. The semiconductor device of claim 1, wherein the first semiconductor fin and the second semiconductor fin are recessed below an upper surface of the intra-device isolation structure.

4. The semiconductor device of claim 1, wherein the first portion of the source/drain structure and the second portion of the source/drain structure merge to form a continuous source/drain region.

5. The semiconductor device of claim 4, wherein an upper surface of the continuous source/drain region facing away from the first semiconductor fin has at least one groove.

6. The semiconductor device of claim 1, wherein the first portion of the source/drain structure is spaced apart from the second portion of the source/drain structure.

7. The semiconductor device of claim 1, further comprising a gate structure over the first semiconductor fin and the second semiconductor fin.

8. The semiconductor device of claim 1, wherein a thickness of the dielectric layer is greater than about 3 nm.

9. A semiconductor device comprising:
a substrate;
a crown structure protruding above the substrate, the crown structure comprising:
  a plurality of fins;
  an intra-device isolation structure between the plurality of fins;
  source/drain regions over the plurality of fins; and
  a dielectric layer over and in physical contact with the intra-device isolation structure, wherein the dielectric layer is between the plurality of fins; and
an inter-device isolation structure over the substrate and on opposing sides of the crow structure, wherein an upper surface of the inter-device isolation structure distal from the substrate is free of the dielectric layer.

10. The semiconductor device of claim 9, wherein the source/drain regions comprise a first portion directly over a first fin of the plurality of fins, and comprise a second portion directly over a second fin of the plurality of fins.

11. The semiconductor device of claim 10, wherein the dielectric layer extends continuously along an upper surface of the intra-device isolation structure from a first sidewall of the first portion of the source/drain regions to an opposing second sidewall of the second portion of the source/drain regions.

12. The semiconductor device of claim 10, wherein the source/drain regions extend continuously from the first fin to the second fin.

13. The semiconductor device of claim 10, wherein the first portion of the source/drain regions has a first peak, and the second portion of the source/drain regions has a second peak, wherein a pitch between the first peak and the second peak is substantially equal to a pitch between the first fin and the second fin.

14. The semiconductor device of claim 9, wherein a lower surface of the intra-device isolation structure facing the substrate extends further from the substrate than a lower surface of the inter-device isolation structure facing the substrate.

15. The semiconductor device of claim 14, wherein an upper surface of a first fin of the plurality of fins distal from the substrate is closer to the substrate than an upper surface of the intra-device isolation structure distal from the substrate.

16. A method for manufacturing a semiconductor device, the method comprising:
forming inter-device isolation structures over a substrate;
forming a crown structure between the inter-device isolation structures, the crown structure comprising semiconductor fins and an intra-device isolation structure between the semiconductor fins;
forming a gate structure over the semiconductor fins;
forming a dielectric layer over the crown structure and over the inter-device isolation structures, wherein the dielectric layer is formed to be in physical contact with the intra-device isolation structure and the inter-device isolation structures; and
recessing the semiconductor fins using an etching process, wherein the etching process removes the dielectric layer from the semiconductor fins and from the inter-device isolation structures, wherein after the etching process, the dielectric layer over the intra-device isolation structure remains, and upper surfaces of the inter-device isolation structures distal from the substrate are free of the dielectric layer.

17. The method of claim 16, wherein recessing the semiconductor fins recesses upper surfaces of the semiconductor fins below an upper surface of the intra-device isolation structure.

18. The method of claim 16, further comprising, after recessing the semiconductor fins, forming source/drain regions on the semiconductor fins.

19. The method of claim 18, wherein the source/drain regions extend continuously over the semiconductor fins, wherein there is a void between the source/drain regions and the dielectric layer disposed over the intra-device isolation structure.

20. The method of claim 16, wherein the etching process is a plasma etching process.

* * * * *